US009543396B2

(12) United States Patent
Georgescu et al.

(10) Patent No.: US 9,543,396 B2
(45) Date of Patent: Jan. 10, 2017

(54) VERTICAL TRANSISTOR DEVICE STRUCTURE WITH CYLINDRICALLY-SHAPED REGIONS

(71) Applicant: Power Integrations, Inc., San Jose, CA (US)

(72) Inventors: Sorin Stefan Georgescu, San Jose, CA (US); Wayne Byran Grabowski, Los Altos, CA (US); Kamal Raj Varadarajan, Santa Clara, CA (US); Lin Zhu, Campbell, CA (US); Kuo-Chang Robert Yang, Campbell, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 14/520,527

(22) Filed: Oct. 22, 2014

(65) Prior Publication Data
US 2015/0171174 A1  Jun. 18, 2015

Related U.S. Application Data

(60) Provisional application No. 61/915,772, filed on Dec. 13, 2013.

(51) Int. Cl.
*H01L 29/66* (2006.01)
*H01L 29/40* (2006.01)
(Continued)

(52) U.S. Cl.
CPC ......... *H01L 29/407* (2013.01); *H01L 29/0696* (2013.01); *H01L 29/4238* (2013.01);
(Continued)

(58) Field of Classification Search
CPC .......... H01L 29/66; H01L 29/40; H01L 29/78; H01L 29/7811; H01L 29/407; H01L 29/404
See application file for complete search history.

(56) References Cited

U.S. PATENT DOCUMENTS 4,343,015 A   8/1982   Baliga et al.
4,531,173 A   7/1985   Yamada
(Continued)

FOREIGN PATENT DOCUMENTS

CN   1469487   1/2004
CN   1806341   7/2006
(Continued)

OTHER PUBLICATIONS

Mehrotra et al. "Trench MOS Barrier Schottky (TMBS) Rectifier: A Schottky Rectifier with Higher Than Parallel Plane Breakdown Voltage". Solid State Electronics, Elsevier Science Publishers, Barking, GB. vol. 38, No. 4, Apr. 1, 1995. pp. 801-806. XP004024828. ISBN; 0038-1101.

*Primary Examiner* — Daniel Luke
*Assistant Examiner* — Khatib Rahman
(74) *Attorney, Agent, or Firm* — The Law Offices of Bradley J. Bereznak

(57) ABSTRACT

A vertical power transistor device includes a semiconductor layer of a first conductivity type, with a plurality of cylindrically-shaped dielectric regions disposed in the semiconductor layer. The cylindrically-shaped dielectric regions extend in a vertical direction from a top surface of the semiconductor layer downward. Adjacent ones of the cylindrically-shaped dielectric regions being laterally separated along a common diametrical axis by a narrow region of the semiconductor layer having a first width. Each dielectric region has a cylindrically-shaped, conductive field plate member centrally disposed therein. The cylindrically-shaped, conductive field plate member extends in the vertical direction from the top surface downward to near a (Continued)

bottom of the dielectric region. The dielectric region laterally separates the cylindrically-shaped, conductive field plate member from the narrow region. A source region is disposed at the top surface, and a drain region is disposed at the bottom, of the semiconductor layer.

19 Claims, 6 Drawing Sheets

(51) Int. Cl.
    *H01L 29/423*     (2006.01)
    *H01L 29/06*     (2006.01)
    *H01L 29/78*     (2006.01)
    *H01L 29/739*     (2006.01)

(52) U.S. Cl.
    CPC .. *H01L 29/66666* (2013.01); *H01L 29/66712* (2013.01); *H01L 29/66734* (2013.01); *H01L 29/7802* (2013.01); *H01L 29/7813* (2013.01); *H01L 29/7827* (2013.01); *H01L 29/7397* (2013.01); *H01L 29/7811* (2013.01)

(56) References Cited

U.S. PATENT DOCUMENTS

| | | |
|---|---|---|
| 4,553,084 A | 11/1985 | Wrathall |
| 4,618,541 A | 10/1986 | Forouhi et al. |
| 4,626,789 A | 12/1986 | Nakata et al. |
| 4,626,879 A | 12/1986 | Colak |
| 4,665,426 A | 5/1987 | Allen et al. |
| 4,738,936 A | 4/1988 | Rice |
| 4,754,310 A | 6/1988 | Coe |
| 4,764,800 A | 8/1988 | Sander |
| 4,769,685 A | 9/1988 | MacIver et al. |
| 4,796,070 A | 1/1989 | Black |
| 4,811,075 A | 3/1989 | Eklund |
| 4,890,144 A | 12/1989 | Teng et al. |
| 4,890,146 A | 12/1989 | Williams et al. |
| 4,908,682 A | 3/1990 | Takahashi |
| 4,922,327 A | 5/1990 | Mena et al. |
| 4,926,074 A | 5/1990 | Singer et al. |
| 4,926,243 A | 5/1990 | Nakagawa et al. |
| 4,929,987 A | 5/1990 | Einthoven |
| 4,939,566 A | 7/1990 | Singer et al. |
| 4,951,102 A | 8/1990 | Beitman et al. |
| 4,963,951 A | 10/1990 | Adler et al. |
| 4,967,246 A | 10/1990 | Tanaka |
| 5,008,794 A | 4/1991 | Leman |
| 5,010,024 A | 4/1991 | Allen et al. |
| 5,025,296 A | 6/1991 | Fullerton et al. |
| 5,040,045 A | 8/1991 | McArthur et al. |
| 5,068,700 A | 11/1991 | Yamaguchi et al. |
| 5,072,266 A | 12/1991 | Bulucea et al. |
| 5,072,268 A | 12/1991 | Rumennik |
| 5,122,848 A | 6/1992 | Lee et al. |
| 5,146,298 A | 9/1992 | Eklund |
| 5,155,574 A | 10/1992 | Yamaguchi |
| 5,164,891 A | 11/1992 | Keller |
| 5,237,193 A | 8/1993 | Williams et al. |
| 5,258,636 A | 11/1993 | Rumennik et al. |
| 5,270,264 A | 12/1993 | Andideh et al. |
| 5,274,259 A | 12/1993 | Grabowski et al. |
| 5,285,367 A | 2/1994 | Keller |
| 5,294,824 A | 3/1994 | Okada |
| 5,306,656 A | 4/1994 | Williams et al. |
| 5,313,082 A | 5/1994 | Eklund |
| 5,323,044 A | 6/1994 | Rumennik et al. |
| 5,324,683 A | 6/1994 | Fitch et al. |
| 5,326,711 A | 7/1994 | Malhi |
| 5,349,225 A | 9/1994 | Redwine et al. |
| 5,359,221 A | 10/1994 | Miyamoto et al. |
| 5,386,136 A | 1/1995 | Williams et al. |
| 5,396,097 A | 3/1995 | Robb et al. |
| 5,408,141 A | 4/1995 | Devore et al. |
| 5,411,901 A | 5/1995 | Grabowski et al. |
| 5,412,239 A | 5/1995 | Williams |
| 5,438,215 A | 8/1995 | Tihanyi |
| 5,473,180 A | 12/1995 | Ludikhuize |
| 5,514,608 A | 5/1996 | Williams et al. |
| 5,521,105 A | 5/1996 | Hsu et al. |
| 5,550,405 A | 8/1996 | Cheung et al. |
| 5,612,567 A | 3/1997 | Baliga |
| 5,637,898 A | 6/1997 | Baliga |
| 5,648,283 A | 7/1997 | Tsang et al. |
| 5,654,206 A | 8/1997 | Merrill |
| 5,656,543 A | 8/1997 | Chung |
| 5,659,201 A | 8/1997 | Wollesen |
| 5,663,599 A | 9/1997 | Lur |
| 5,665,994 A | 9/1997 | Palara |
| 5,670,828 A | 9/1997 | Cheung et al. |
| 5,679,608 A | 10/1997 | Cheung et al. |
| 5,716,887 A | 2/1998 | Kim |
| 5,760,440 A | 6/1998 | Kitamura et al. |
| 5,798,554 A | 8/1998 | Grimaldi et al. |
| 5,821,144 A | 10/1998 | D'Anna et al. |
| 5,821,580 A | 10/1998 | Kuwahara |
| 5,869,875 A | 2/1999 | Herbert |
| 5,917,216 A | 6/1999 | Floyd et al. |
| 5,929,481 A | 7/1999 | Hshieh et al. |
| 5,943,595 A | 8/1999 | Akiyama et al. |
| 5,969,408 A | 10/1999 | Perelli |
| 5,973,360 A | 10/1999 | Tihanyi |
| 5,998,833 A | 12/1999 | Baliga |
| 6,010,926 A | 1/2000 | Rho et al. |
| 6,049,108 A | 4/2000 | Williams et al. |
| 6,054,752 A | 4/2000 | Hara et al. |
| 6,084,277 A | 7/2000 | Disney et al. |
| 6,127,703 A | 10/2000 | Letavic et al. |
| 6,133,607 A | 10/2000 | Funaki et al. |
| 6,168,983 B1 | 1/2001 | Rumennik et al. |
| 6,184,555 B1 | 2/2001 | Tihanyi et al. |
| 6,191,447 B1 | 2/2001 | Baliga |
| 6,194,283 B1 | 2/2001 | Gardner et al. |
| 6,207,994 B1 | 3/2001 | Rumennik et al. |
| 6,251,716 B1 | 6/2001 | Yu |
| 6,281,705 B1 | 8/2001 | Yu |
| 6,294,818 B1 | 9/2001 | Fujihira |
| 6,304,007 B1 | 10/2001 | Yu |
| 6,307,223 B1 | 10/2001 | Yu |
| 6,316,807 B1 | 11/2001 | Fujishima et al. |
| 6,337,498 B1 | 1/2002 | Hasegawa et al. |
| 6,349,047 B1 | 2/2002 | Yu |
| 6,353,252 B1 | 3/2002 | Yasuhara et al. |
| 6,355,513 B1 | 3/2002 | Yu |
| 6,356,059 B1 | 3/2002 | Yu |
| 6,359,308 B1 | 3/2002 | Hijzen et al. |
| 6,362,064 B2 | 3/2002 | McGregor et al. |
| 6,365,932 B1 | 4/2002 | Kouno et al. |
| 6,388,286 B1 | 5/2002 | Baliga |
| 6,404,009 B1 | 6/2002 | Mori |
| 6,424,007 B1 | 7/2002 | Disney |
| 6,462,377 B2 | 10/2002 | Hurky et al. |
| 6,465,291 B1 | 10/2002 | Disney |
| 6,468,847 B1 | 10/2002 | Disney |
| 6,486,011 B1 | 11/2002 | Yu |
| 6,489,190 B2 | 12/2002 | Disney |
| 6,501,130 B2 | 12/2002 | Disney |
| 6,504,209 B2 | 1/2003 | Disney |
| 6,509,220 B2 | 1/2003 | Disney |
| 6,525,372 B2 | 2/2003 | Baliga |
| 6,528,880 B1 | 3/2003 | Planey |
| 6,542,001 B1 | 4/2003 | Yu |
| 6,549,439 B1 | 4/2003 | Yu |
| 6,552,597 B1 | 4/2003 | Disney |
| 6,555,873 B2 | 4/2003 | Disney et al. |
| 6,555,883 B1 | 4/2003 | Disney et al. |
| 6,563,171 B2 | 5/2003 | Disney |
| 6,566,936 B1 | 5/2003 | Yu |
| 6,570,219 B1 | 5/2003 | Rumennik et al. |
| 6,573,558 B2 | 6/2003 | Disney |
| 6,580,252 B1 | 6/2003 | Yu |
| 6,583,663 B1 | 6/2003 | Disney |

(56) References Cited

U.S. PATENT DOCUMENTS

| | | |
|---|---|---|
| 6,614,289 B1 | 9/2003 | Yu |
| 6,621,722 B1 | 9/2003 | Yu |
| 6,633,065 B2 | 10/2003 | Rumennik et al. |
| 6,635,544 B2 | 10/2003 | Disney |
| 6,639,277 B2 | 10/2003 | Rumennik et al. |
| 6,661,276 B1 | 12/2003 | Chang |
| 6,667,213 B2 | 12/2003 | Disney |
| 6,674,107 B1 | 1/2004 | Yu |
| 6,677,741 B2 | 1/2004 | Taylor |
| 6,680,646 B2 | 1/2004 | Disney |
| 6,683,344 B2 | 1/2004 | Tsukanov et al. |
| 6,683,346 B2 | 1/2004 | Zeng |
| 6,696,706 B1 | 2/2004 | Pegler |
| 6,724,041 B2 | 4/2004 | Rumennik et al. |
| 6,730,585 B2 | 5/2004 | Disney |
| 6,734,714 B2 | 5/2004 | Disney |
| 6,734,715 B2 | 5/2004 | Yu |
| 6,747,342 B1 | 6/2004 | Planey |
| 6,750,105 B2 | 6/2004 | Disney |
| 6,750,698 B1 | 6/2004 | Yu |
| 6,759,289 B2 | 7/2004 | Disney |
| 6,764,889 B2 | 7/2004 | Baliga |
| 6,768,171 B2 | 7/2004 | Disney |
| 6,768,172 B2 | 7/2004 | Rumennik et al. |
| 6,774,417 B1 | 8/2004 | Lin et al. |
| 6,777,722 B1 | 8/2004 | Yu et al. |
| 6,777,749 B2 | 8/2004 | Rumennik et al. |
| 6,781,194 B2 | 8/2004 | Baliga |
| 6,781,198 B2 | 8/2004 | Disney |
| 6,787,437 B2 | 9/2004 | Rumennik et al. |
| 6,787,847 B2 | 9/2004 | Disney et al. |
| 6,787,848 B2 | 9/2004 | Ono et al. |
| 6,798,020 B2 | 9/2004 | Disney et al. |
| 6,800,903 B2 | 10/2004 | Rumennik et al. |
| 6,809,354 B2 | 10/2004 | Okada et al. |
| 6,812,079 B1 | 11/2004 | Pegler |
| 6,815,293 B2 | 11/2004 | Disney et al. |
| 6,818,490 B2 | 11/2004 | Disney |
| 6,825,536 B2 | 11/2004 | Disney |
| 6,828,631 B2 | 12/2004 | Rumennik et al. |
| 6,838,346 B2 | 1/2005 | Disney |
| 6,865,093 B2 | 3/2005 | Disney |
| 6,882,005 B2 | 4/2005 | Disney et al. |
| 6,887,768 B1 | 5/2005 | Yu |
| 6,900,506 B1 | 5/2005 | Yu et al. |
| 6,921,932 B1 | 7/2005 | Yu et al. |
| 6,975,157 B1 | 12/2005 | Yu |
| 6,987,299 B2 | 1/2006 | Disney et al. |
| 6,995,052 B1 | 2/2006 | Yu et al. |
| 7,009,228 B1 | 3/2006 | Yu |
| 7,009,229 B1 | 3/2006 | Lin et al. |
| 7,038,260 B1 | 5/2006 | Yu |
| 7,045,397 B1 | 5/2006 | Yu et al. |
| 7,075,132 B1 | 7/2006 | Lin et al. |
| 7,098,634 B1 | 8/2006 | Yu |
| 7,115,958 B2 | 10/2006 | Disney et al. |
| 7,122,885 B2 | 10/2006 | Planey |
| 7,135,748 B2 | 11/2006 | Balakrishnan |
| 7,211,845 B1 | 5/2007 | Yu et al. |
| 7,220,629 B2 | 5/2007 | Balakrishnan |
| 7,220,661 B1 | 5/2007 | Yu et al. |
| 7,221,011 B2 | 5/2007 | Banerjee et al. |
| 7,227,242 B1 | 6/2007 | Lin et al. |
| 7,238,976 B1 | 7/2007 | Yu et al. |
| 7,253,042 B2 | 8/2007 | Disney |
| 7,253,059 B2 | 8/2007 | Balakrishnan |
| 7,262,461 B1 | 8/2007 | Yu et al. |
| 7,265,398 B1 | 9/2007 | Yu |
| 7,268,378 B1 | 9/2007 | Yu et al. |
| 7,335,944 B2 | 2/2008 | Banerjee |
| 7,345,342 B2 | 3/2008 | Challa et al. |
| 7,348,826 B1 | 3/2008 | Klein et al. |
| 7,381,618 B2 | 6/2008 | Disney |
| 7,391,088 B2 | 6/2008 | Balakrishnan |
| 7,417,266 B1 | 8/2008 | Li et al. |
| 7,452,763 B1 | 11/2008 | Yu |
| 7,459,366 B2 | 12/2008 | Banrjee |
| 7,468,536 B2 | 12/2008 | Parthasarathy |
| 7,492,212 B1 | 2/2009 | Kadow et al. |
| 7,494,875 B2 | 2/2009 | Disney |
| 7,554,152 B1 | 6/2009 | Ranucci et al. |
| 7,557,406 B2 | 7/2009 | Parthasarathy |
| 7,585,719 B2 | 9/2009 | Balakrishnan |
| 7,595,523 B2 | 9/2009 | Parthasarathy et al. |
| 7,608,888 B1 | 10/2009 | Li et al. |
| 7,648,879 B2 | 1/2010 | Banerjee et al. |
| 7,655,964 B1 | 2/2010 | Lin et al. |
| 7,696,540 B2 | 4/2010 | Francis et al. |
| 7,696,598 B2 | 4/2010 | Francis et al. |
| 7,732,860 B2 | 6/2010 | Parthasarathy et al. |
| 7,745,291 B2 | 6/2010 | Disney |
| 7,746,156 B1 | 6/2010 | Massie et al. |
| 7,786,533 B2 * | 8/2010 | Disney ............... H01L 29/0696 257/341 |
| 7,791,132 B2 | 9/2010 | Banerjee et al. |
| 7,816,731 B2 | 10/2010 | Parthasarathy et al. |
| 7,829,944 B2 | 11/2010 | Disney |
| 7,859,037 B2 | 12/2010 | Parthasarathy et al. |
| 7,863,172 B2 | 1/2011 | Zhu |
| 7,871,882 B2 | 1/2011 | Parthasarathy |
| 7,875,962 B2 | 1/2011 | Balakrishnan |
| 7,893,754 B1 | 2/2011 | Kung |
| 7,932,738 B1 | 4/2011 | Banerjee et al. |
| 7,939,853 B2 | 5/2011 | Murphy et al. |
| 7,964,912 B2 | 6/2011 | Parthasarathy et al. |
| 7,998,817 B2 | 8/2011 | Disney |
| 7,999,606 B2 | 8/2011 | Kung et al. |
| 8,022,456 B2 | 9/2011 | Parthasarathy et al. |
| 8,410,551 B2 | 4/2013 | Parthasarathy et al. |
| 2001/0015459 A1 | 8/2001 | Watanabe et al. |
| 2002/0056884 A1 | 5/2002 | Baliga |
| 2002/0175351 A1 | 11/2002 | Baliga |
| 2003/0020134 A1 * | 1/2003 | Werner ............... H01L 27/0705 257/471 |
| 2003/0038335 A1 | 2/2003 | Huang et al. |
| 2003/0136974 A1 | 7/2003 | Yedinak et al. |
| 2003/0209757 A1 | 11/2003 | Henninger et al. |
| 2003/0209781 A1 | 11/2003 | Hattori |
| 2005/0001257 A1 | 1/2005 | Schloesser et al. |
| 2005/0133858 A1 | 6/2005 | Banerjee et al. |
| 2005/0145977 A1 | 7/2005 | Alessandria et al. |
| 2005/0167742 A1 | 8/2005 | Challa et al. |
| 2005/0167749 A1 | 8/2005 | Disney |
| 2005/0218963 A1 | 10/2005 | Ball et al. |
| 2005/0263852 A1 | 12/2005 | Ogura et al. |
| 2007/0029597 A1 | 2/2007 | Lee et al. |
| 2007/0105384 A1 | 5/2007 | McCutcheon et al. |
| 2007/0138547 A1 | 6/2007 | Nakamura |
| 2007/0187753 A1 | 8/2007 | Pattanayak et al. |
| 2007/0200183 A1 | 8/2007 | Rueb et al. |
| 2007/0272977 A1 | 11/2007 | Saito et al. |
| 2008/0197396 A1 | 8/2008 | Parthasarathy |
| 2008/0197397 A1 | 8/2008 | Parthasarathy et al. |
| 2008/0197406 A1 | 8/2008 | Parthasarathy et al. |
| 2008/0197418 A1 | 8/2008 | Parthasarathy et al. |
| 2008/0272428 A1 * | 11/2008 | Letavic ............... H01L 29/407 257/330 |
| 2010/0155831 A1 | 6/2010 | Parthasarathy et al. |
| 2010/0213470 A1 | 8/2010 | Yamazaki et al. |
| 2015/0041889 A1 * | 2/2015 | Sun ............... H01L 29/7813 257/331 |

FOREIGN PATENT DOCUMENTS

| | | |
|---|---|---|
| CN | 101246908 | 7/2011 |
| DE | 4309764 | 9/1994 |
| EP | 0962987 | 12/1999 |
| EP | 0987766 | 3/2000 |
| EP | 1073123 | 1/2001 |
| EP | 1168455 | 1/2002 |
| EP | 1689001 | 8/2006 |
| EP | 1959496 | 8/2008 |
| EP | 1959497 | 8/2008 |

(56) References Cited

FOREIGN PATENT DOCUMENTS

| | | |
|---|---|---|
| GB | 2309336 | 1/1997 |
| JP | 56038867 | 4/1981 |
| JP | 57010975 | 1/1982 |
| JP | 57012557 | 1/1982 |
| JP | 57012558 | 1/1982 |
| JP | 60064471 | 4/1985 |
| JP | 1238037 | 9/1989 |
| JP | 3211771 | 9/1991 |
| JP | 4107877 | 4/1992 |
| JP | 4107867 | 7/1992 |
| JP | 6120510 | 4/1994 |
| JP | 6196630 | 6/1994 |
| JP | 6224426 | 8/1994 |
| JP | 07045817 | 2/1995 |
| JP | 08046193 | 2/1996 |
| JP | 09008295 | 1/1997 |
| JP | 05160408 | 6/1997 |
| JP | 09213951 | 8/1997 |
| JP | 9266311 | 10/1997 |
| JP | 9298298 | 11/1997 |
| JP | 10107282 | 4/1998 |
| JP | 10256545 | 9/1998 |
| JP | 11233765 | 8/1999 |
| JP | 2000012854 | 1/2000 |
| JP | 2001168329 | 6/2001 |
| JP | 2002043562 | 2/2002 |
| JP | 2002170955 | 6/2002 |
| JP | 2004079955 | 3/2004 |
| JP | 2004087520 | 3/2004 |
| JP | 2004200540 | 7/2004 |
| JP | 2006032420 | 2/2006 |
| JP | 2006216927 | 8/2006 |
| JP | 2006351930 | 12/2006 |
| JP | 20070266505 | 10/2007 |
| JP | 20080205483 | 9/2008 |
| WO | 9735346 | 9/1997 |
| WO | 9934449 | 7/1999 |
| WO | 0033385 | 6/2000 |
| WO | 0241402 | 5/2002 |
| WO | 02099909 | 12/2002 |
| WO | 03023861 | 3/2003 |
| WO | 2007105384 | 9/2007 |

* cited by examiner

Potential Contours and at Pinch Off
Voltage = 70 V
N=1.0E+15

Potential Contours and at Pinch Off
Voltage = 120 V
N=2.0E+15

VERTICAL TRANSISTOR DEVICE STRUCTURE WITH CYLINDRICALLY-SHAPED REGIONS

REFERENCE TO RELATED APPLICATIONS

The present application claims priority to and the benefit of U.S. Provisional Patent Application Ser. No. 61/915,772, filed Dec. 13, 2013, entitled, "Vertical Transistor Device Structure With Cylindrically-Shaped Regions", the entirety of which is hereby incorporated by reference.

TECHNICAL FIELD

The present disclosure relates to semiconductor devices fabricated in a silicon substrate. More specifically, the present invention relates to vertical field-effect transistor device structures capable of withstanding high voltages.

BACKGROUND

High-voltage, field-effect transistors (HVFETs), also known as power transistors, are well known in the semiconductor arts. Most often, HVFETs comprise a vertical transistor device structure that includes an extended drain region that supports the applied high-voltage when the device is in the "off" state. HVFETs of this type are commonly used in power conversion applications such as AC/DC converters for offline power supplies, motor controls, and so on. These power transistor devices can be switched at high voltages and achieve a high blocking voltage in the "off" state while minimizing the resistance to current flow between the drain and source, often referred to as the specific on-resistance ($Rds_{on}$), in the "on" state.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
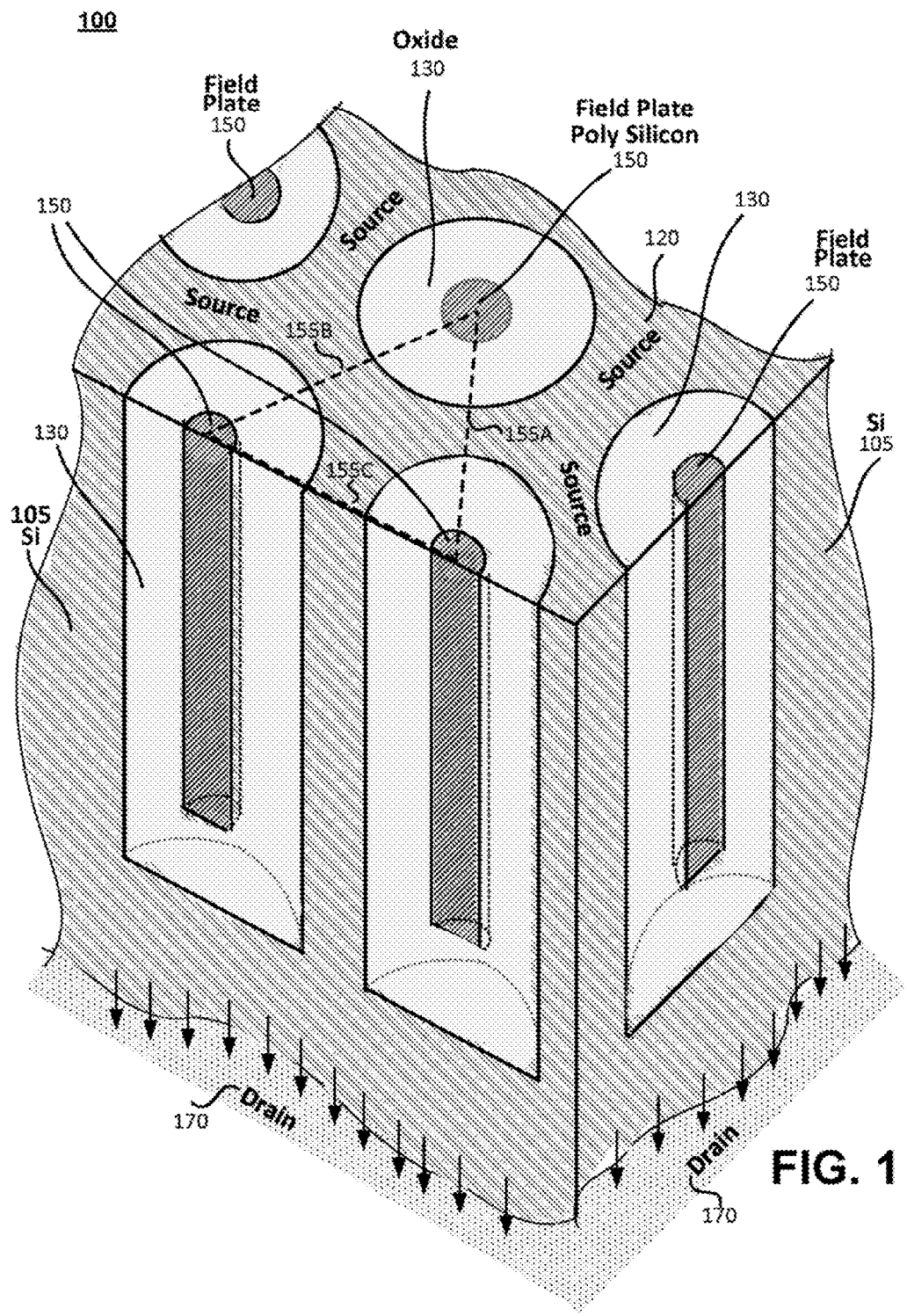
FIG. 1 is a cross-sectional perspective view of an example vertical transistor device structure with cylindrically-shaped regions.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description numerous specific details are set forth in order to provide a thorough understanding of the present invention. It will be apparent, however, to one having ordinary skill in the art that the specific details need not be employed to practice the present invention. In other instances, well-known systems, devices, or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

For purposes of this disclosure, "ground" or "ground potential" refers to a reference voltage or potential against which all other voltages or potentials of a circuit or integrated circuit (IC) are defined or measured.

A vertical power transistor device structure having cylindrically-shaped regions is described. The vertical power transistor device structure has a low specific on-state resistance and supports high voltage in the off-state. In other embodiments the same device structure and layout may be utilized to implement a variety of different devices, including P-N diodes, high voltage Schottky diodes, junction field-effect transistors (JFETs), insulated-gate bipolar transistors (IGBTs), and the like.

The high voltage vertical power transistors may utilize field plates that help to reshape the electric filed around a central semiconductor pillar or mesa and thus increase the breakdown voltage. The cylindrically-shaped structure of the different regions in a vertical power transistor device described in this application allows a compact size with an increased voltage ratings and an efficient utilization of the silicon volume.

FIG. 1 is an example cross-sectional perspective view of a vertical transistor device 100 with cylindrically-shaped regions. The vertical transistor device structure of FIG. 1 includes a plurality of cylindrically-shaped dielectric regions 130 (e.g., oxide) disposed in a semiconductor layer 105 (e.g., silicon), which in one embodiment comprises an n-type epitaxial layer. Centrally disposed within each region 130 (e.g., dielectric region of oxide), and fully insulated from semiconductor layer 105, is a cylindrically-shaped conductive field plate member 150, which in one embodiment comprises polysilicon. Note that the cylindrically-shaped dielectric regions 130 are arranged in a layout consisting of adjacent rows that are offset from one another such that the lateral distance between any two adjacent cylindrically-shaped dielectric regions 130 is equal at all points along the sidewall interface between the dielectric material of regions 130 and the semiconductor material of layer 105 as illustrated by the equal length of h dashed lines 155A, 155B and 155C.

As shown in FIG. 1, the cylindrically-shaped dielectric regions 130 extend in a vertical direction from a top surface of semiconductor layer 105 downward towards a substrate (not shown). Adjacent ones of the cylindrically-shaped dielectric regions 130 are laterally separated along a common diametrical axis by a narrow region of the semiconductor layer 105. This narrow region that separates each adjacent pair of dielectric regions 130 has a lateral width that is constant at all points along the oxide-silicon interface extending vertically downward. In one embodiment, this narrow region comprises an extended drain or drift region of the vertical power field-effect transistor formed by an epitaxial process. The drift regions, dielectric layers 130, and field plate members 150 collectively comprise a parallel-layered structure that extends in a lateral direction, which is perpendicular to the direction of current flow in the on-state.

Note that in the device structure 100 shown in FIG. 1 any three nearest laterally adjacent dielectric regions 130 comprises a triad of the cylindrically-shaped dielectric regions, i.e., the layout of any three nearest cylindrically-shaped dielectric regions 130 are arranged in a triangular pattern. FIG. 1 shows this triangular layout arrangement with the equal length dashed lines 155A, 155B and 155C that connect from the center of three nearest field plate members 150 forming an equilateral triangle.

In one embodiment, each of the cylindrically-shaped dielectric regions 130 may be formed by first etching deep trenches into semiconductor layer 105. The trenches are then filled with a dielectric material (e.g., silicon dioxide). A cylindrically-shaped field plate member 150 may be formed through similar masking, etching, and filling steps. In the example of FIG. 1 a MOSFET device source electrode may be disposed on the top surface of semiconductor layer 105, and a drain electrode may be disposed on the bottom surface of semiconductor layer 105.

Figure 2:
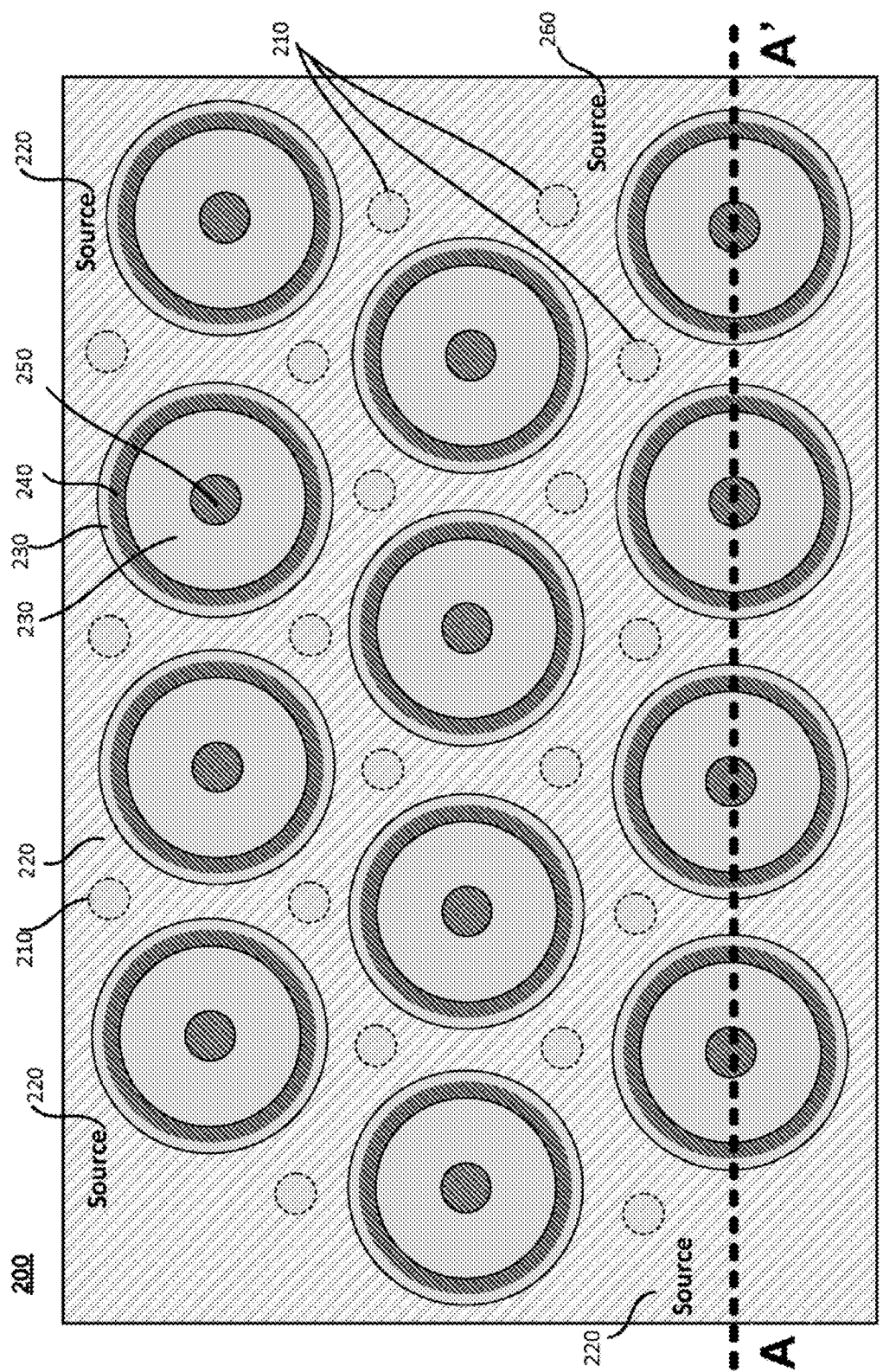
FIG. 2 is a top view of an example layout of the vertical transistor device structure shown in FIG. 1.

FIG. 2 is a top view of an example layout 200 of the vertical transistor device structure shown in FIG. 1. In this view, an array of cylindrically-shaped dielectric regions 230 is arranged in offset rows about the top surface (source) 220 of the semiconductor layer (e.g., silicon). A cylindrically-shaped field plate member 250 is disposed in the center of each cylindrically-shaped dielectric region 230. Layout 200 also shows each cylindrically-shaped dielectric region 230 further including a laterally extending ring-shaped gate member 240 disposed in a trench therein between the semiconductor material and the cylindrically-shaped conductive field plate member 250. A thin gate oxide separates gate member 240 from the top surface 220 of the semiconductor layer.

Persons of skill in the art appreciate that in different embodiments gate members 240 may be planar formed on portions of the top surface 220 with a thin layer of dielectric (e.g., silicon dioxide) separating each gate member 240 from the semiconductor layer.

As shown in FIG. 2, a relatively larger silicon area (marked by dashed lines 210) is formed between each of three adjacent cylindrically-shaped dielectric regions 230. Each of the interior-located, cylindrically-shaped dielectric regions 230 is surrounded by six other cylindrically-shaped dielectric regions 230 and six narrow conduction channels disposed at different lateral directions around each cylindrically-shaped dielectric region 230. In certain embodiments, the silicon area marked by dashed lines 210 may be trenched and filled with a dielectric material (e.g., oxide, nitride, etc.). These additional dielectric-filled trenches may be cylindrical in shape, extending vertically down from top surface 220 into a partial depth of the bulk semiconductor layer material (e.g., silicon).

Figure 3A:
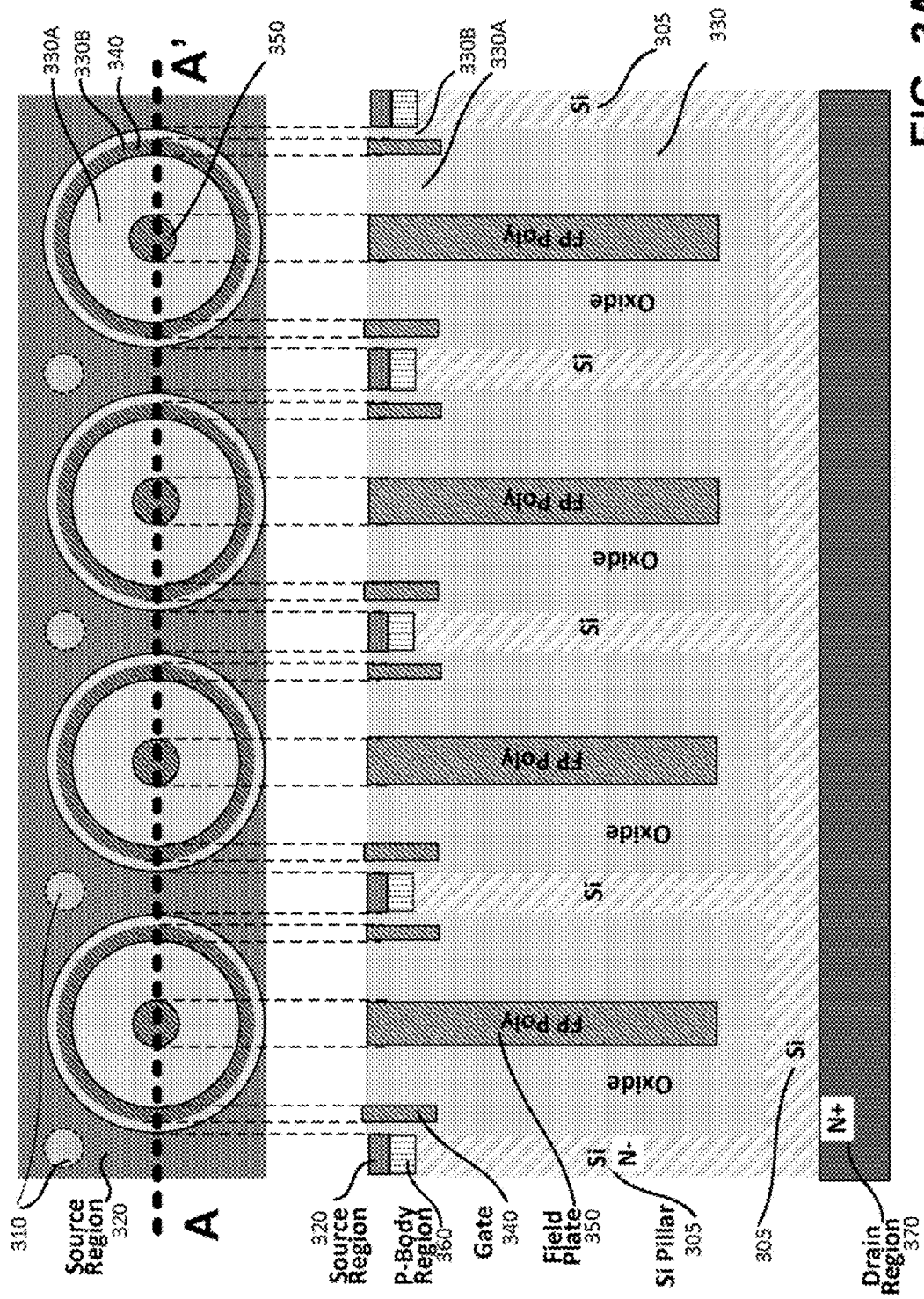
FIG. 3A is an example cross-sectional side view of one embodiment of the vertical transistor device structure layout shown in FIG. 2, taken along cut lines A-A'.

FIG. 3A is an example cross-sectional side view of one embodiment of the vertical transistor device structure layout shown in FIG. 2, taken along cut line A-A' of a single row of cylindrical dielectric regions 330. In this example, gate members 340 are each shown as a trench gate member that extends downward in a vertical direction from the top surface of the dielectric material (oxide) to a depth just beneath the laterally adjacent bottom of p-type body region 360. Each body region 360 is disposed beneath N+ source region (top surface) 320. Body region 360 thus vertically separates source region 320 from the extended drain or drift region of silicon pillar 305. In the embodiment shown, dielectric regions 330 are shown comprising a relatively thick interior dielectric region 330A that separates gate member 340 from field plate member 350, and a relatively thin layer (e.g., oxide) 330B that fully insulates each of gate members 340 (e.g., polysilicon) from the semiconductor material that includes source region 320, P-body region 360, and pillar 305.

In FIG. 3A, conductive field plate members 350 are centrally-disposed in the center of the cylindrically-shaped dielectric regions 330. Ring-shaped gate members 340 are disposed in dielectric regions 330 between the semiconductor material (regions 320, 360 and 305) and cylindrically-shaped field plate members 350. As shown, silicon pillars 305 are connected by silicon material that extends laterally beneath each dielectric region 330. An N+ doped drain region 370 is disposed beneath the bottom of silicon pillars 305. In certain embodiments, the doping concentration in silicon pillars is formed by a graded epitaxial process such that the doping concentration in the drift region increases with vertical depth from just beneath body region 360, down to near N+ doped drain region 370.

During normal on-state operation of the vertical power transistor shown in FIG. 3A a control signal is applied to the gate members 340. In response, vertical conducting channel regions are formed along the sides of P-body regions 360 such that current flows from source region 320 downward through the conducting channels formed along the sides of P-body regions 360, through the N-type drift regions of silicon pillars 305 to N+ drain region 370. A drain electrode (not shown) may be formed on the bottom of drain region 370.

In the vertical transistor technologies state, a high voltage (e.g., 100V-1200V) is typically applied across the respective drain and source regions 370 & 320. (Source region 320 and field plate members 350 are typically grounded.) As the voltage increases, the presence of field plate regions 350 on opposite sides of the narrow drift regions 305 cause the N-type drift regions to become depleted of free carriers.

Figure 3B:
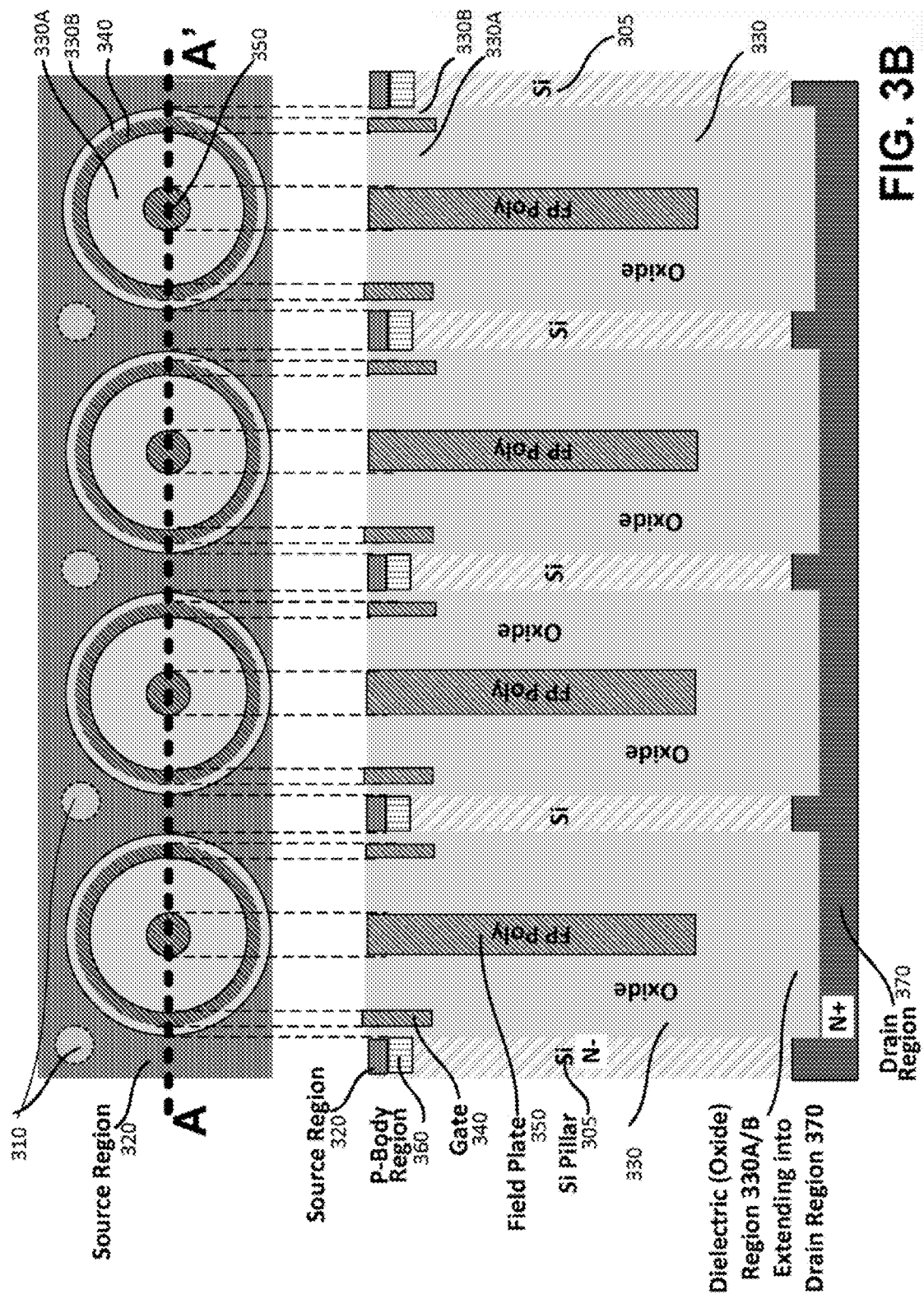
FIG. 3B is an example cross-sectional side view of another embodiment the vertical transistor device structure layout shown in FIG. 2, taken along cut lines A-A'.

FIG. 3B is an example cross-sectional side view of another embodiment of the vertical transistor device structure layout shown in FIG. 2, taken along cut lines A-A'. The embodiment of FIG. 3B is substantially the same as that shown in FIG. 3A, except that in FIG. 3B each of the cylindrically-shaped dielectric regions 330 extends downward into the underlying drain region 370.

In yet another embodiment, drain region 370 may be disposed on top of a P-type substrate.

Practitioners in the semiconductor arts will appreciate that the vertical transistor device structure described herein improves device performance over conventional vertical transistor structures. The reason why is because during device breakdown, the breakdown voltage is mainly determined by the voltage supported by the dielectric (oxide) layer. The cylindrical shape of the silicon-oxide-poly field plate in the vertical transistor device structure disclosed herein achieves higher electric field along the oxide. This is largely due to the symmetrical and homogeneous distribution of the electric field in all lateral directions and along the cylindrically-shaped dielectric regions. Thus, the transistor device structure described herein achieves a higher breakdown voltage with smaller dimensions and less volume of dielectric (oxide) material.

Figure 4:
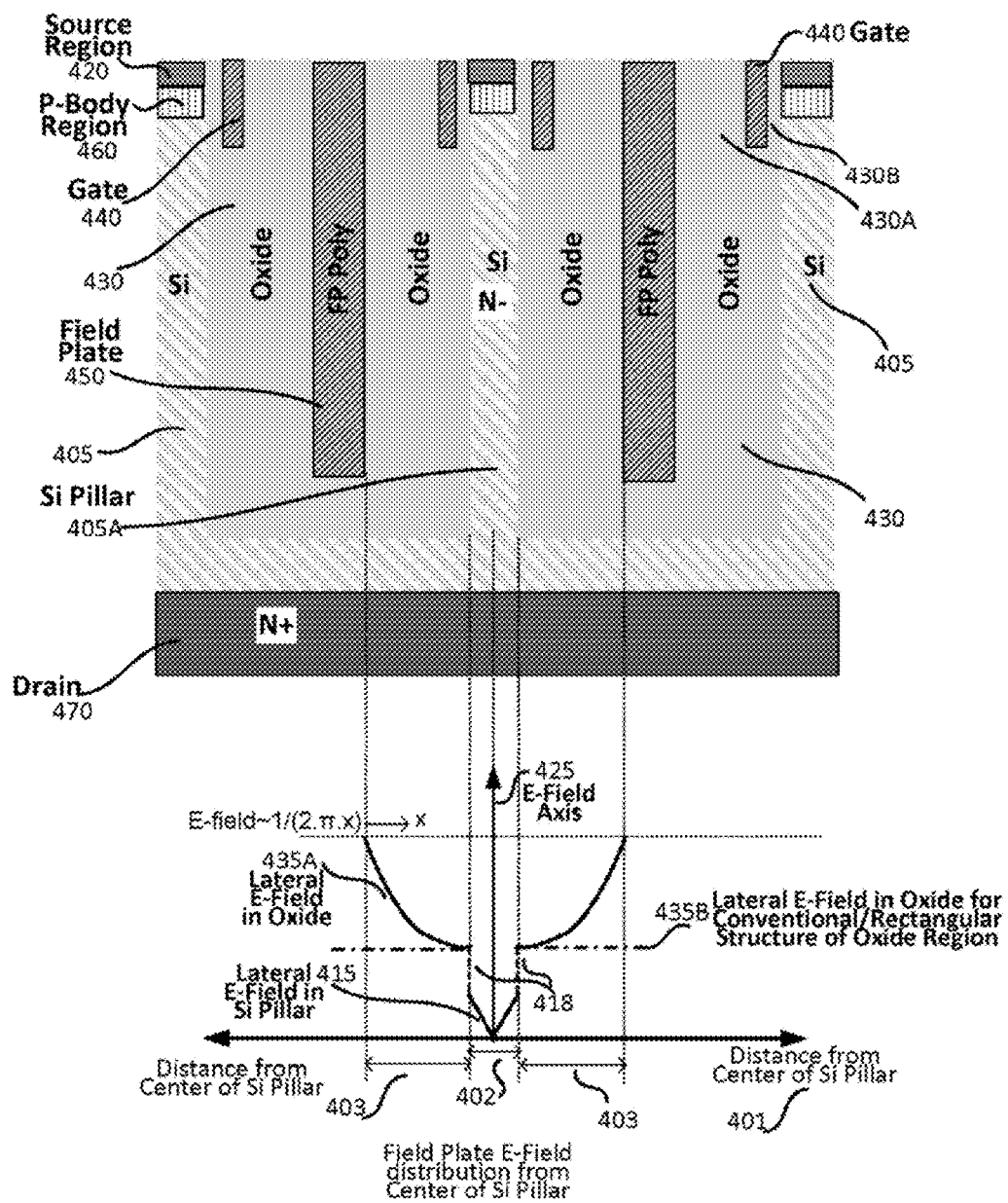
FIG. 4 is a cross-sectional side view of the embodiment of FIG. 3A with a graph illustrating the electric field (E-field) distribution in various regions of the device.

FIG. 4 shows a cross-sectional side view of the embodiment of FIG. 3A with a graph (below the device structure) illustrating the electric field (E-field) distribution in various regions of the device. In FIG. 4, the lateral electric field strength in dielectric region 430 is shown by lines 435A. Lines 435A show an inverse trend of electric field (E-field) change/reduction versus the radial distance from the field plate $[E \sim 1/(2\pi x)]$ along the radial directions from the field plate towards the border of silicon pillar 405A. This inverse trend is due to the expansion of the field lines out toward the lateral boundary of the cylindrical-shaped dielectric region 430. This variation is shown by curve 435A in FIG. 4 in comparison to the lateral E-field in a conventional/rectangular shaped structure of oxide region that is shown by the straight line 435B.

Variation of the lateral electric field strength (on E-field axis 425) in silicon pillar 405A is shown by linear lines 415. Note that the electric field strength of the E-field at the interface between pillar 405A and dielectric region 430 shows a jump 418 in value. The width of the narrow region of silicon pillar 405A is denoted by reference numeral 402, whereas the distance between silicon pillar 415 and field plate member (polysilicon) 450 is denoted by reference numeral 403. In one embodiment the cylindrically-shaped dielectric regions 430 are separated by a lateral distance 402 of approximately 1.5 microns, with a lateral oxide thickness 403 of approximately 5.5 microns.

Practitioners in the semiconductor arts will further appreciate that the novel vertical device structure disclosed herein supports a higher electric field with the same breakdown voltage; or, stated differently, the same electric field can be achieved with a thinner lateral oxide thickness 450. This means that a vertical transistor device structure may achieve better device performance with less oxide area Less oxide area translates into more silicon area, and thus lower $Rds_{on}$ as compared with prior art vertical transistor device layouts. Furthermore, due to the thinner oxide required to realize the same high breakdown voltage, the processing required to fabricate the vertical device structure described herein is significantly reduced and simplified as compared to conventional vertical power transistor devices.

Figure 5A:
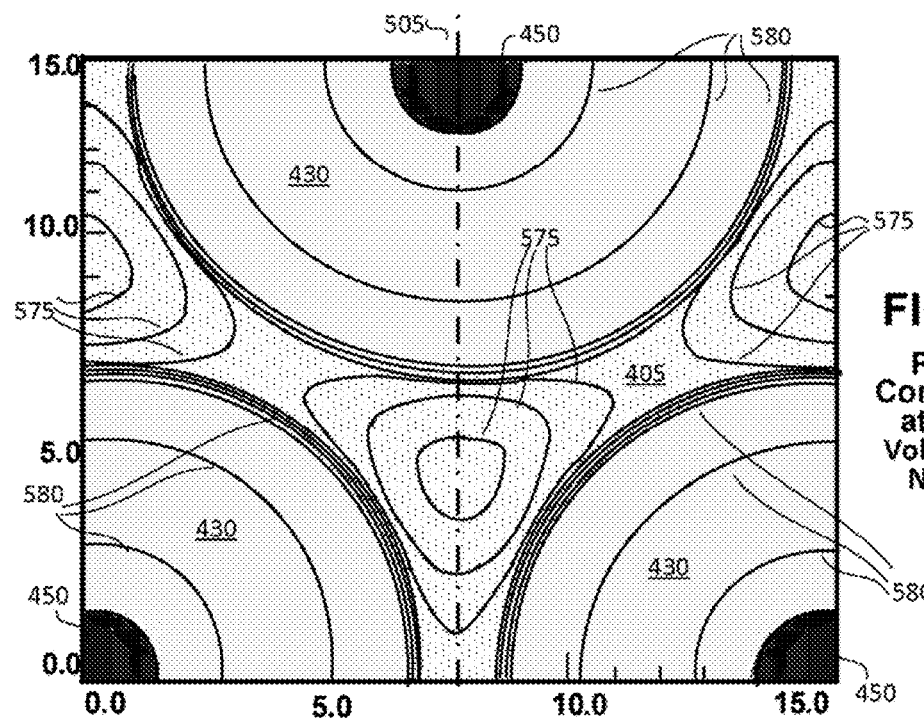
FIGS. 5A-5B illustrate simulation results showing the potential contours as a function of distance for an example vertical transistor device for different doping and voltage conditions.
Figure 5B:
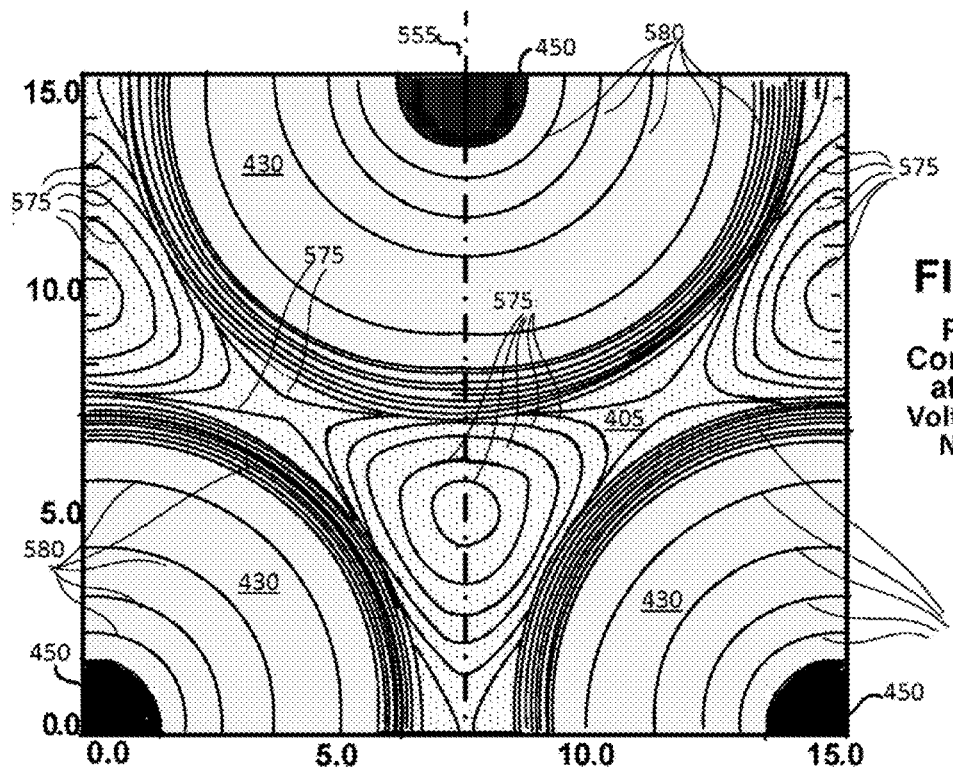

FIGS. 5A-5B illustrate simulation results showing the potential contours as a function of distance for an example vertical transistor device with the cylindrically-shaped structure and with graded doping in the semiconductor pillar wherein the doping concentration of impurity in the drift region gradually changes (increases) with vertical depth from just beneath the body region down towards the bottom drain region (N+ substrate). Each of the two-dimensional graphs of FIG. 5A and FIG. 5B demonstrates the potential contours in a specific lateral cross-section at a specific vertical depth and a specific doping concentration, at a pinch off voltage that fully depletes the cross-section of majority carriers. The electric field lines are not shown in the drafted simulation results but the lateral electric field may be calculated from the potential contours shown, and the vertical electric field may be calculated from the pinch off voltage and vertical position of each cross-section. Note that the simulation results shown are for a layout wherein the cylindrically-shaped dielectric regions are separated by a lateral distance 402 of approximately 1.5 microns; with a lateral oxide thickness 403 of approximately 5.5 microns (see FIG. 4). In the example simulation results of FIG. 5A silicon pillar/drift region 405 is shown having a doping concentration of about $1 \times 10^{15}/cm^3$, with a pinch-off voltage of 70 V. FIG. 5B shows example simulation results for the doping concentration of about $2 \times 10^{15}/cm^3$, with a pinch-off voltage of 120 V. In one embodiment, the doping concentration in the drift region varies as a function of vertical depth from near the body region down to near the N+ drain region. In a particular embodiment the doping concentration varies from about $1 \times 10^{15}/cm^3$ near the top of the drift region to about $1 \times 10^{17}/cm^3$ near the bottom of the drift region, with a pinch-off voltage varying from 70 V to 810 V.

Each of the two-dimensional graphs of FIG. 5A and FIG. 5B illustrate the potential contours for a vertical device with graded doping in a specific lateral cross section at a particular vertical depth of silicon pillar/drift region 405, and specific doping concentrations at a pinch-off voltage that fully depletes the cross-section of majority carriers. In FIG. 5A, field plate members 450 are centrally-disposed in dielectric regions 430 in a triad arrangement. The circular pattern lines 580 show the potential contours around each cylindrical field plate member 450 and inside each cylindrical dielectric region 430. A higher density of potential contour lines 580 in the dielectric region 430 is seen near the silicon region. The potential contour lines 575 are inside the silicon pillar/drift region 405 that separate each dielectric region 430.

FIG. 5B shows a similar simulation result at a different lateral cross section of the vertical device with graded doping at a vertical depth wherein the doping concentration is $2 \times 10^{15}/cm^3$ with a pinch-off voltage level of 120 V. The three cylindrical field plate members 450 are in a symmetrical triangle arrangement. The circular potential contour lines 580 show the potential contours in dielectric region 430 around each cylindrical field plate member 450. In comparison to the simulation result of FIG. 5A, the potential contour lines 580 in FIG. 5B show a higher density within dielectric region 430. The potential contour lines 575 are inside silicon pillar/drift region 405 and are formed due to the symmetrical effect of the electric field of the three adjacent cylindrically shaped field plates and dielectric regions. Potential contour lines 575 show a symmetrical pattern about central axis 505 in FIG. 5A, and central axis 555 in FIG. 5B, of the three adjacent cylindrically-shaped field plate members 450 and dielectric regions 430.

The above description of illustrated example embodiments, including what is described in the Abstract, are not intended to be exhaustive or to be limitation to the precise forms or structures disclosed. While specific embodiments and examples of the subject matter described herein are for illustrative purposes, various equivalent modifications are possible without departing from the broader spirit and scope of the present invention. Indeed, it is appreciated that the specific example thicknesses, material types, concentrations, voltages, etc., are provided for explanation purposes and that other values may also be employed in other embodiments and examples in accordance with the teachings of the present invention.

We claim:

1. A vertical power transistor device comprising:
    a semiconductor layer of a first conductivity type;
    a plurality of cylindrically-shaped dielectric regions disposed in the semiconductor layer, each cylindrically-shaped dielectric region having an outer side that extends in a vertical direction from a top surface of the semiconductor layer downward, each cylindrically-shaped dielectric region having a circular cross-section in a horizontal plane perpendicular to the vertical direction, adjacent ones of the cylindrically-shaped dielectric regions being laterally separated along a common diametrical axis by a narrow region of the semiconductor layer having a first width;
    each cylindrically-shaped dielectric region having a cylindrical field plate member centrally disposed therein, the cylindrical field plate member having a circular cross-section in the horizontal plane and comprising a conductive material that fully extends laterally across a diameter of the circular cross-section of the cylindrical field plate member, the conductive material extending in the vertical direction from the top surface downward to near a bottom of the cylindrically-shaped dielectric region, the cylindrically-shaped dielectric region laterally separating the cylindrical field plate member from the narrow region;
    a source region of the first conductivity type disposed at the top surface of the narrow region;
    a body region of a second conductivity type, the body region separating the source from a lower portion of the narrow region, the lower portion comprising a drift region;
    a drain region of the first conductivity type disposed beneath the semiconductor layer; and
    a ring-shaped gate member disposed in each cylindrically-shaped dielectric region between the narrow region and the cylindrical field plate member.

2. The vertical power transistor device according to claim 1 wherein a lateral width of the cylindrically-shaped dielectric region separates the cylindrical field plate member from the narrow drift region, the lateral width being substantially the same at all points along a side surface of the cylindrical field plate member.

3. The vertical power transistor device according to claim 1 wherein the ring-shaped gate member is a planar gate member.

4. The vertical power transistor device according to claim 1 wherein the cylindrical field plate members each comprise polysilicon.

5. The vertical power transistor device according to claim 1 wherein a cell of the vertical power transistor device comprises a triad of the cylindrically-shaped dielectric regions in an equilateral triangular arrangement.

6. The vertical power transistor device according to claim 1 further comprising a substrate, the semiconductor layer comprising an epitaxial layer disposed on the substrate.

7. The vertical power transistor device according to claim 1 wherein the substrate is the first conductivity type.

8. The vertical power transistor device according to claim 1 wherein the substrate is a second conductivity type.

9. The vertical power transistor device according to claim 1 wherein the first conductivity type comprises n-type.

10. The vertical power transistor device according to claim 1 wherein each of the cylindrically-shaped dielectric regions extends downward into the drain region.

11. The vertical power transistor device according to claim 1 wherein the drift region has a doping concentration that varies from near the body region down to near the bottom of the drift region.

12. The vertical power transistor device according to claim 1 wherein the drift region comprises an epitaxial layer having a graded doping profile.

13. The vertical power transistor device according to claim 11 wherein the doping concentration is highest near the bottom of the drift region.

14. A high-voltage transistor comprising:
    a substrate;
    an array of cylindrically-shaped dielectric regions disposed in the substrate and arranged in an equilateral triangular layout, each of the cylindrically-shaped dielectric regions having an outer side that extends in a vertical direction from a top surface of the substrate downward, the cylindrically-shaped dielectric regions having a circular cross-section in a horizontal plane perpendicular to the vertical direction, adjacent ones of the cylindrically-shaped dielectric regions being laterally separated along a common diametrical axis by a narrow region of the substrate having a first width;
    each cylindrically-shaped dielectric region having a cylindrical field plate member centrally disposed therein, the cylindrical field plate member having a circular cross-section in the horizontal plane and comprising a conductive material that fully extends laterally across a diameter of the circular cross-section of the cylindrical field plate member, the conductive material extending in the vertical direction from the top surface downward to near a bottom of the cylindrically-shaped dielectric region, the cylindrically-shaped dielectric region laterally separating the cylindrical field plate member from the narrow region;
    a source disposed at the top surface of the narrow region;
    a body region that separates the source from a lower portion of the narrow region, the lower portion comprising a drift region;
    a drain disposed at the bottom of the substrate; and
    a ring-shaped gate member disposed in each cylindrically-shaped dielectric region between the narrow region and the cylindrical field plate member.

15. The high-voltage transistor according to claim 14 wherein the gate member is a planar gate member.

16. The high-voltage transistor according to claim 14 wherein the cylindrically-shaped dielectric regions each comprises an oxide.

17. The high-voltage transistor according to claim 14 wherein the first width is in a range of approximately 1-2 microns wide.

18. The high-voltage transistor according to claim 14 wherein the narrow region has a doping concentration in a range of about $1\times10^{15}/cm^3$ to about $1\times10^{17}/cm^3$.

19. The high-voltage transistor according to claim 14 wherein each of the cylindrically-shaped dielectric regions extends downward into the drain.

* * * * *

UNITED STATES PATENT AND TRADEMARK OFFICE
CERTIFICATE OF CORRECTION

PATENT NO. : 9,543,396 B2  
APPLICATION NO. : 14/520527  
DATED : January 10, 2017  
INVENTOR(S) : Georgescu et al.

Page 1 of 1

It is certified that error appears in the above-identified patent and that said Letters Patent is hereby corrected as shown below:

In the Specification

Column 2, Lines 49-52 read:
"The high voltage vertical power transistors may utilize field plates that help to reshape the electric filed around a central semiconductor pillar or mesa and thus increase the breakdown voltage."

It should read:
"The high voltage vertical power transistors may utilize field plates that help to reshape the electric field around a central semiconductor pillar or mesa and thus increase the breakdown voltage."

Signed and Sealed this
Seventh Day of March, 2017

Michelle K. Lee
*Director of the United States Patent and Trademark Office*